(12) United States Patent
Cheng et al.

(10) Patent No.: US 7,635,627 B2
(45) Date of Patent: Dec. 22, 2009

(54) METHODS FOR FABRICATING A MEMORY DEVICE INCLUDING A DUAL BIT MEMORY CELL

(75) Inventors: Ning Cheng, San Jose, CA (US); Hiroyuki Kinoshita, San Jose, CA (US); Minghao Shen, Sunnyvale, CA (US); Ashot Melik-Martirosian, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 143 days.

(21) Appl. No.: 11/614,050

(22) Filed: Dec. 20, 2006

(65) Prior Publication Data
US 2008/0153228 A1 Jun. 26, 2008

(51) Int. Cl.
*H01L 21/336* (2006.01)
(52) U.S. Cl. ............... 438/257; 438/258; 438/593; 438/E21.209; 438/E21.682; 257/315; 257/320
(58) Field of Classification Search ......... 438/257–258, 438/593–594; 257/314–316
See application file for complete search history.

(56) References Cited

U.S. PATENT DOCUMENTS

| 6,768,160 B1* | 7/2004 | Li et al. ............... 257/315 |
| 2005/0029577 A1* | 2/2005 | Nishizaka et al. ....... 257/315 |

* cited by examiner

*Primary Examiner*—Dung A. Le

(57) ABSTRACT

Methods are provided for fabricating a memory device comprising a dual bit memory cell. The method comprises, in accordance with one embodiment of the invention, forming a gate dielectric layer and a central gate electrode overlying the gate dielectric layer at a surface of a semiconductor substrate. First and second memory storage nodes are formed adjacent the sides of the gate dielectric layer, each of the first and second storage nodes comprising a first dielectric layer and a charge storage layer, the first dielectric layer formed independently of the step of forming the gate dielectric layer. A first control gate is formed overlying the first memory storage node and a second control gate is formed overlying the second memory storage node. A conductive layer is deposited and patterned to form a word line coupled to the central gate electrode, the first control gate, and the second control gate.

20 Claims, 4 Drawing Sheets

METHODS FOR FABRICATING A MEMORY DEVICE INCLUDING A DUAL BIT MEMORY CELL

TECHNICAL FIELD

The present invention generally relates to methods for fabricating memory devices, and more particularly relates to methods for fabricating memory devices that include a dual bit memory cell.

BACKGROUND

One form of semiconductor memory is a nonvolatile memory in which the memory state of a memory cell is determined by whether or not an electrical charge is stored on a charge storage layer built into the gate structure of a field effect transistor. To enhance the storage capacity of such a nonvolatile memory, two storage nodes can be built into each memory cell. The storage nodes are associated with locations in charge storage layers at opposite sides of the gate structure. As the capacity of semiconductor memories increases, the size of each individual device used to implement the memory shrinks in size. With a memory that uses dual storage nodes per memory cell, the reduction in device size means that the spacing between the two storage nodes of a memory cell decreases. As the spacing between storage nodes decreases, problems arise with respect to the reliability and retention of the memory data. Charge stored in one memory node of the memory cell may leak through the gate structure to the other memory node to corrupt the memory stored at that other memory node. Additionally, as device size decreases, programming of one memory node can disturb the data stored in the other memory node due to relatively wide charge distributions in the charge storage layer. Such problems limit the possible choices for erasing such dual bit memory cells.

Accordingly, it is desirable to provide methods for fabricating semiconductor memory devices that have enhanced isolation between memory storage nodes of a dual bit memory cell. In addition, it is desirable to provide methods for fabricating semiconductor memory devices in which a gate insulator separating two memory storage nodes can be formed independently of the insulators of the charge storage node. Additionally, it is desirable to provide methods for fabricating dual bit memory cell devices that can be erased by Fowler-Nordheim (FN) tunneling for less power consumption. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating a memory device comprising a dual bit memory cell. The method comprises, in accordance with one embodiment of the invention, forming a gate dielectric layer and a central gate electrode overlying the gate dielectric layer at a surface of a semiconductor substrate. First and second memory storage nodes are formed adjacent the sides of the gate dielectric layer, each of the first and second storage nodes comprising a first dielectric layer and a charge storage layer, the first dielectric layer formed independently of the step of forming the gate dielectric layer. A first control gate is formed overlying the first memory storage node and a second control gate is formed overlying the second memory storage node. A conductive layer is deposited and patterned to form a word line coupled to the central gate electrode, the first control gate, and the second control gate.

BRIEF DESCRIPTION OF THE DRAWINGS

The present invention will hereinafter be described in conjunction with the following drawing figures, wherein like numerals denote like elements, and wherein FIG. 1 schematically illustrates, in cross section, a memory device comprising a dual bit memory cell in accordance with an embodiment of the invention.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
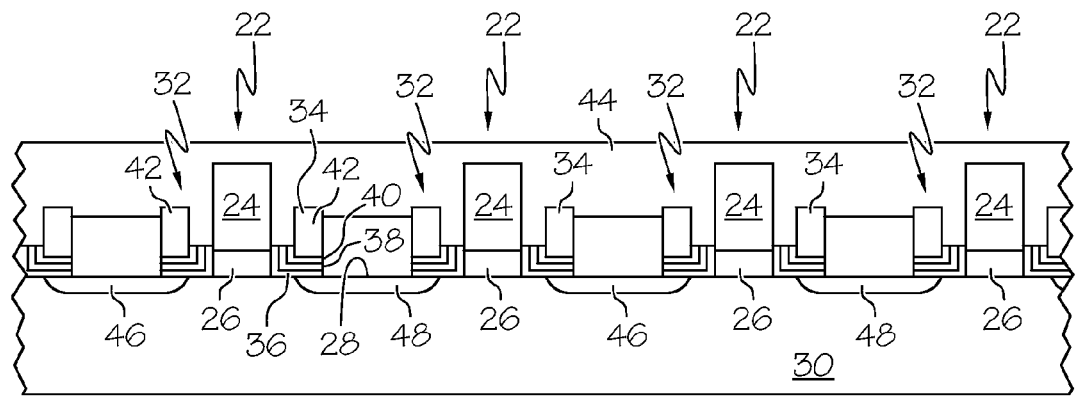

FIG. 1 illustrates schematically, in cross section, a nonvolatile memory device 20 that includes a plurality of dual bit memory cells 22 fabricated in accordance with an embodiment of the invention. Although portions of only four dual bit memory cells are illustrated, those of skill in the art will appreciate that memory device 20 may include a large number of such cells. Each of dual bit memory cells 22 includes a central gate electrode 24 that overlies a gate dielectric 26 formed at a surface 28 of a semiconductor substrate 30. A first memory storage node 32 is formed at one side of gate dielectric 26 and a second memory storage node 34 is formed at the opposite side of the gate dielectric. Each of the memory storage nodes includes, in accordance with one embodiment of the invention, a thin tunnel dielectric layer 36, a charge storage layer 38, a blocking dielectric layer 40 and a control gate 42. A conductive word line 44 is coupled to the central gate electrode and the control gates of each of a plurality of memory cells in a row of memory device 20. Alternating first bit lines 46 and second bit lines 48 are formed in the semiconductor substrate in the semiconductor substrate in alignment with the charge storage nodes. The bit lines are shared between adjacent memory cells.

FIGS. 2-12 schematically illustrate, in cross section, method steps for fabricating a memory device such as memory device 20 in accordance with various embodiments of the invention. Many of the steps employed in the fabrication of semiconductor devices are well known and so, in the interest of brevity, some of those conventional steps will only be mentioned briefly herein or will be omitted entirely without providing the well known process details.

Figure 2:
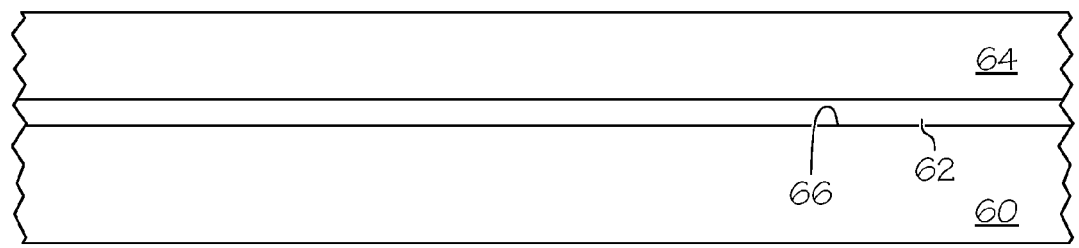
FIG. 2-12 schematically illustrate, in cross section, method steps in accordance with the various embodiments of the invention for fabricating a memory device comprising a dual bit memory cell.

The method begins, as illustrated in FIG. 2, with a semiconductor substrate 60, preferably a silicon substrate, at the surface of which is formed a gate dielectric layer 62. A layer of conductive gate electrode forming material 64 is deposited on the gate dielectric layer. The conductive gate electrode forming material is preferably a layer of polycrystalline silicon, and the layer will hereinafter be referred to, for convenience but without limitation, as a layer of polycrystalline silicon. Although not illustrated, a layer of hard mask material may be deposited on the layer of polycrystalline silicon. Gate dielectric layer 62 is preferably a thermally grown layer of silicon dioxide having a thickness of about 5-30 nanometers (nm), although the layer can be formed of other dielectric materials that are grown or deposited at surface 66 of the semiconductor substrate. As is well known, dielectric materials can be deposited, for example, by chemical vapor deposition (CVD), low pressure chemical vapor deposition (LPCVD) or plasma enhanced chemical vapor deposition (PECVD). The layer of polycrystalline silicon can be deposited by, for example, LPCVD by the reduction of silane (SiH$_4$) or other silicon source material and can be deposited either as an undoped or as an impurity doped layer. The layer of polycrystalline silicon preferably has a thickness of about 30-120 nm.

Semiconductor substrate 60 will hereinafter be referred to, for convenience of discussion but without limitation, as a silicon substrate. As used herein, the term "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. The silicon substrate can be a bulk silicon wafer as illustrated or can be a thin layer of silicon on an insulator (SOI) that, in turn is supported by a semiconductor carrier substrate.

Figure 3:
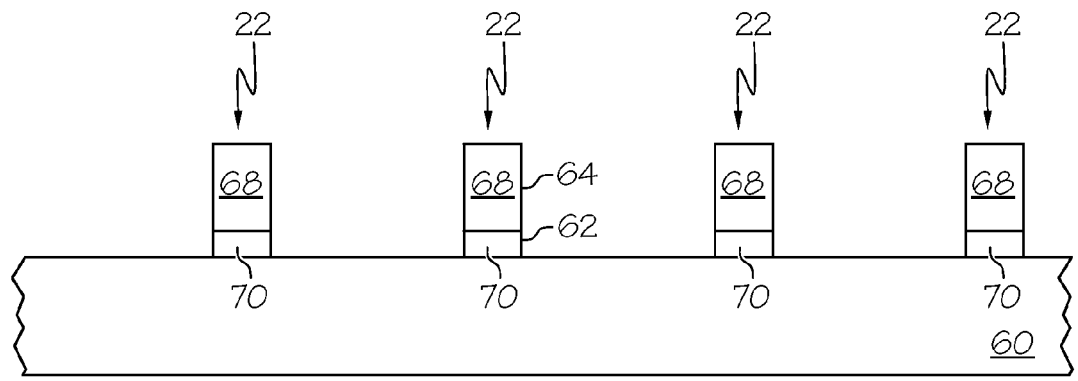

As illustrate in FIG. 3, polycrystalline silicon layer 64 and gate dielectric layer 62 are patterned and etched to form a central gate electrode 68 and gate dielectric 70 for each memory cell 22 of semiconductor device 20. The polycrystalline silicon and gate dielectric layer can be etched using conventional photolithography and etch techniques.

Figure 4:
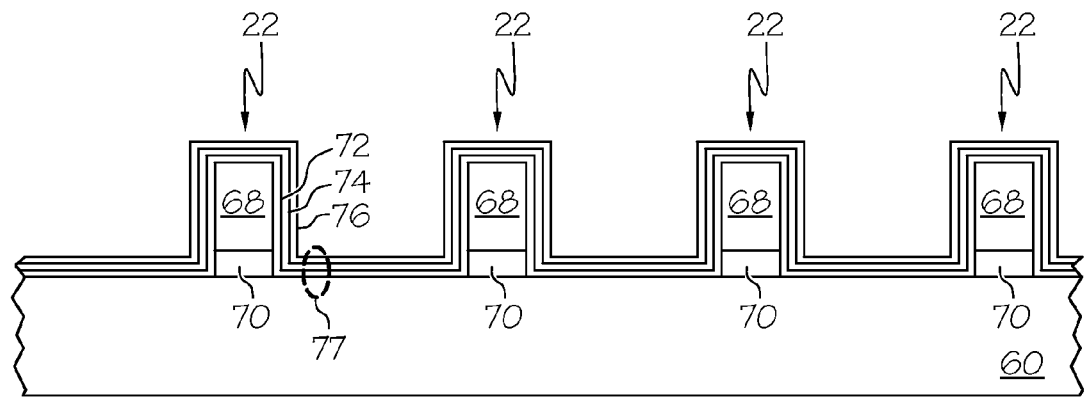

In accordance with one embodiment of the invention a layer of oxide 72 is deposited over the gate electrodes and gate dielectric and a layer of charge storage material 74 is deposited over the layer of oxide. A further charge barrier layer of oxide 76 is deposited over the layer of charge storage material with the three layers forming an O—R—O layered storage node structure 77 as illustrated in FIG. 4 where "R" indicates a generic charge storage material. Although described for convenience as a deposited oxide layer, layer of oxide 72 (the first "O" of O—R—O) also can be a thermally grown layer of silicon dioxide or can be formed of a dielectric material other than an oxide. Layer of oxide 72 preferably is preferably a tunneling layer having a thickness of about 3-12 nm that allows tunneling of charge carriers between the semiconductor substrate and the charge storage layer. In accordance with an embodiment of the invention, layer 72 is formed independently of layer 70 of gate dielectric. By forming the two layers independently, the thickness of the two layers and their composition can be independently specified. Independently forming layer 72 and layer 70 has beneficial implications for allowing Fowler-Nordheim erasing of the memory cells as explained below.

Charge storage layer 74 can be a deposited layer of silicon nitride, silicon rich silicon nitride, polycrystalline silicon, or other charge storage material. Silicon rich silicon nitride is a silicon nitride having a silicon content greater than the silicon content of stoichiometric silicon nitride. Silicon rich nitride is more conductive than stoichiometric silicon nitride and tends to have shallower trap energy levels and higher trap density, both of which allow electrons to move easily to enable Fowler-Nordheim erase of the memory storage node. The charge storage layer can be deposited, for example by LPCVD to a thickness of preferably about 4-12 nm. If the charge storage layer is silicon nitride or silicon rich silicon nitride, the layer can be deposited, for example, by the reaction of dichlorosilane (SiH$_2$Cl$_2$) and ammonia. If the charge storage layer is polycrystalline silicon, the layer can be deposited by, for example, the reduction of silane. Charge barrier layer 76 (the second "O" of O—R—O) can be a silicon oxide or a high dielectric constant (high-K) insulator such as HfSiO, or the like. Preferably the layer is deposited by LPCVD to a thickness of about 4-15 nm. The charge barrier layer can also be formed of a layer of silicon oxide together with a layer of high-K dielectric material (not illustrated).

Figure 5:
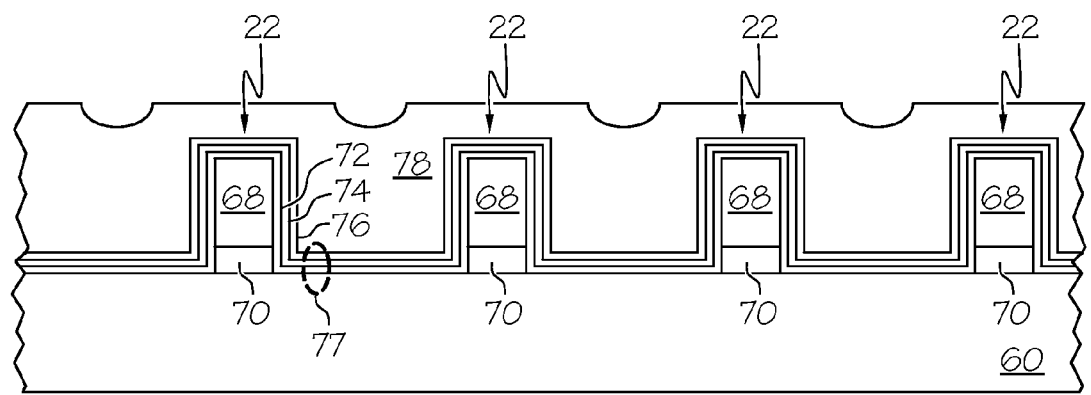

The method continues, in accordance with an embodiment of the invention by the deposition of a layer of conductive material 78 over charge barrier layer 76 as illustrated in FIG. 5. Preferably the layer of conductive material is a layer of polycrystalline silicon, and the layer will hereinafter be referred to, for convenience of description but without limitation, as a layer of polycrystalline silicon. The layer of polycrystalline silicon is deposited to a thickness sufficient to substantially fill the spaces between gate electrodes 68. Preferably the layer of polycrystalline silicon is deposited as a doped layer of polycrystalline silicon by the addition of an impurity dopant species such as arsenic to the reactants used to deposit the layer.

Figure 6:
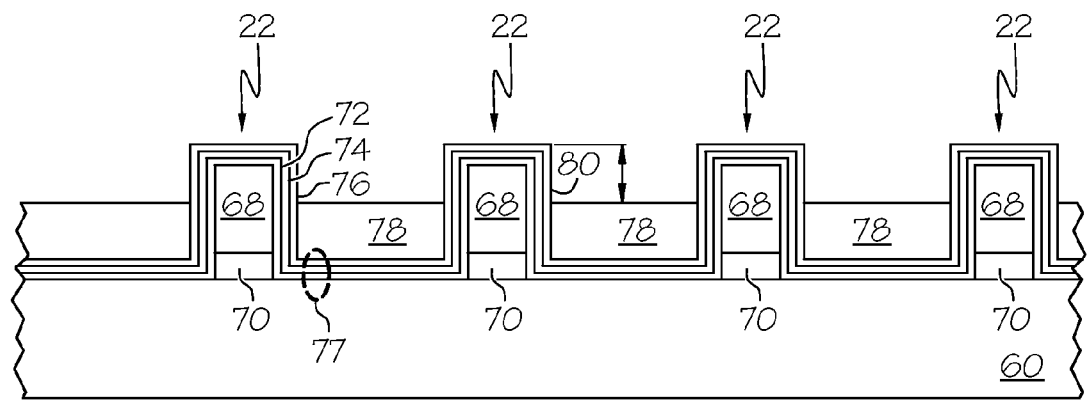

As illustrated in FIG. 6, layer of polycrystalline silicon 78 is etched back to expose a portion 80 of layered structure 72, 74, 76 at a sidewall 81 of central gate electrode 68. A portion of sidewall 81 and portion 80 of the layered structure thus extend above surface 82 of the etched polycrystalline silicon layer 78. The polycrystalline silicon layer can be etched, for example, by plasma etching in a Cl or HBr/O$_2$ chemistry.

Figure 7:
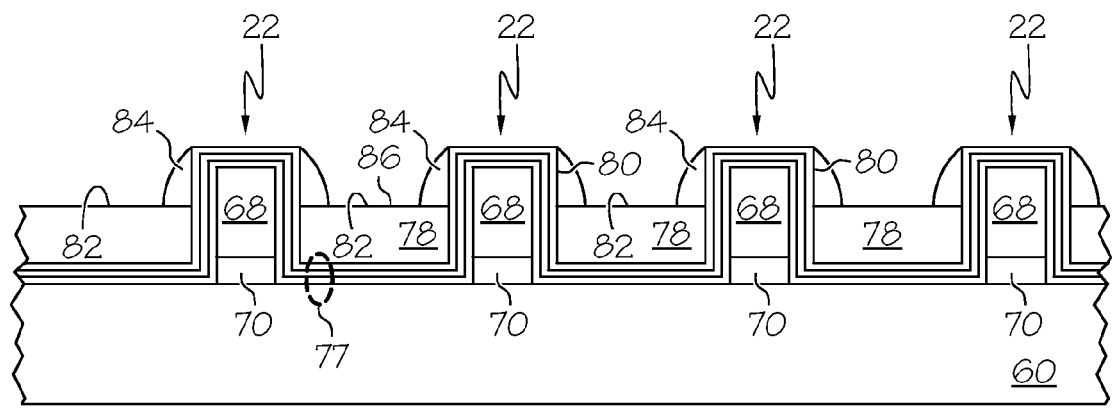

In accordance with an embodiment of the invention a layer of silicon nitride or other sidewall spacer forming material is deposited over the etched back polycrystalline silicon layer and exposed portion 80 of the layered structure on sidewall 81. The sidewall spacer forming material is anisotropically etched, for example by reactive ion etching (RIE) in a CHF$_3$, CF$_4$, or SF$_6$ chemistry to form sidewall spacers 84 on exposed portion 80 of the layered structure and adjacent sidewalls 81 of the central gate electrodes as illustrated in FIG. 7. The sidewall spacers expose a portion 86 of surface 82 of etched back polycrystalline silicon layer 78.

Figure 8:
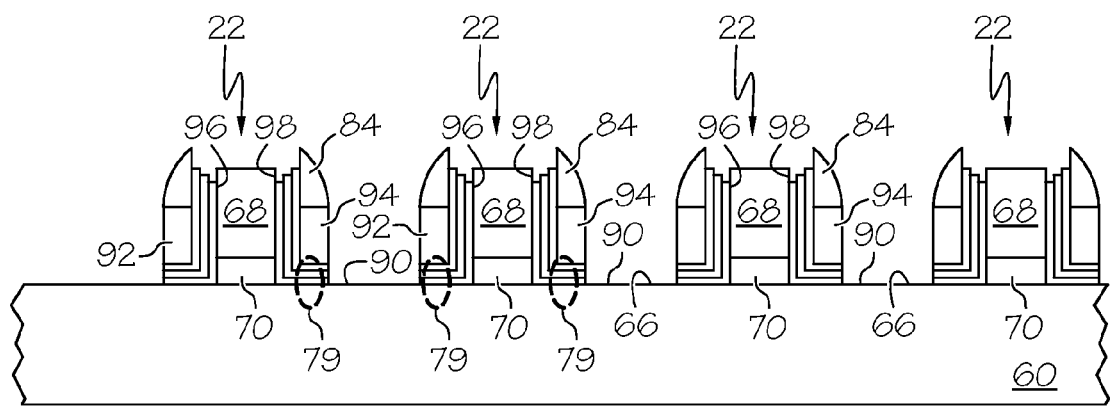

Sidewall spacers 84 are used as an etch mask to etch the exposed portion of polycrystalline silicon layer 78, the layered structure overlying the top of central gate electrode 68 and the portion of layered structure 77 subsequently exposed after the etching of layer 78. The etching also removes a portion of the layered structure along sidewalls 81. The etching can be accomplished, for example by plasma etching in a Cl or HBr/O$_2$ chemistry to etch the polycrystalline silicon and in a CHF$_3$, CF$_4$, or SF$_6$ chemistry to etch the layered O—R—O structure. The etching exposes the top of central gate electrode 68 and a portion 90 of surface 66 of the semiconductor substrate. The etching also forms control gates 92 and 94 adjacent opposite sides 96 and 98, respectively, of central gate electrode 68 and overlying a charge storage node portion 79 of layered structure 77 as illustrated in FIG. 8.

Figure 9:
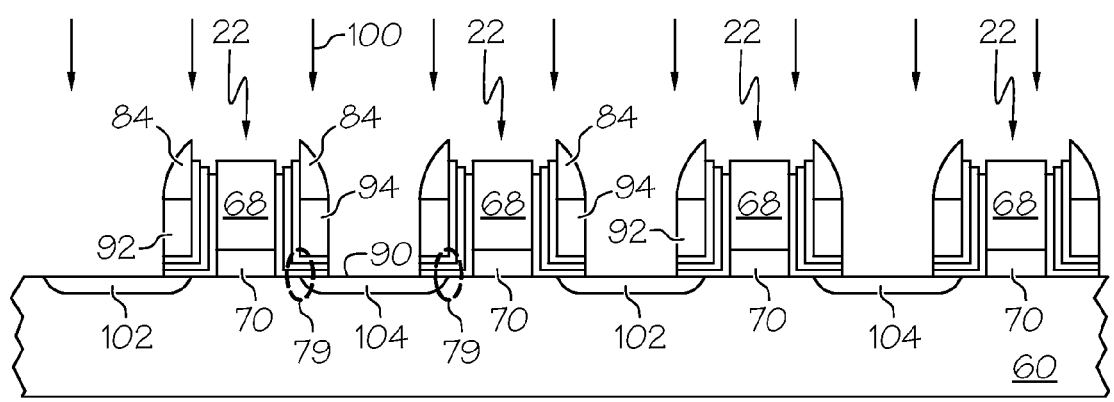

As illustrated in FIG. 9, sidewall spacers 84 are also used as an ion implantation mask and conductivity determining ions are implanted into exposed portions 90 of the semiconductor substrate as indicated by arrows 100 to form bit lines 102 and 104. The bit lines are formed adjacent to and aligned with the memory storage nodes. Bit lines are shared between adjacent memory cells. The ion implantation also impurity dopes central gate electrodes 68. The implanted ions can be arsenic or phosphorus to form N-type bit lines. Those of skill in the art will understand that additional ion implantations, either N-type or P-type, may also be used to dope the channel region of the memory storage cell to control threshold voltage, punch through voltage, and the like.

Figure 10:
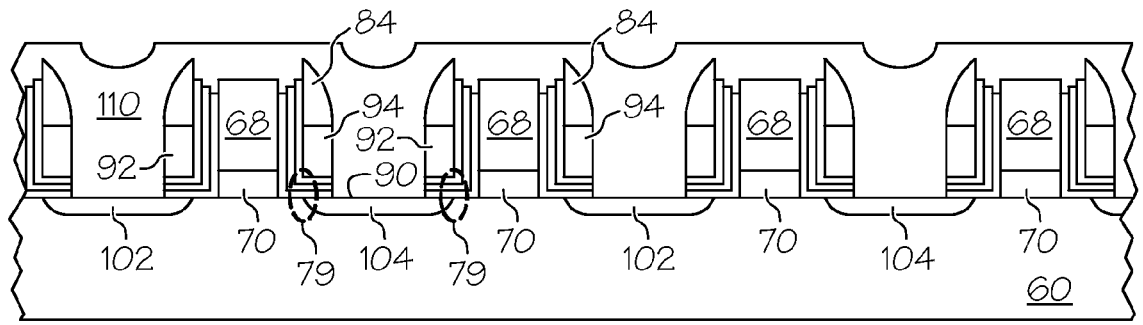

The method continues by the deposition of a dielectric layer 110. The dielectric layer is deposited to a thickness at least sufficient to fill the spaces between the gate electrode structures as illustrated in FIG. 10. Layer 110 can be, for example, a layer of silicon oxide deposited by a high temperature (HTO) deposition process, a high density plasma (HDP) deposition process, or by an LPCVD or PECVD process using, for example, tetraethylorthosilicate (TEOS) as a reactant source. The resultant structure, if the insulator is deposited by an HTO process, is illustrated in FIG. 10 and the following figures. The topography of layer 110 would be somewhat different, as would be understood by those of skill in the art, if the layer is deposited by a HDP process.

Figure 11:
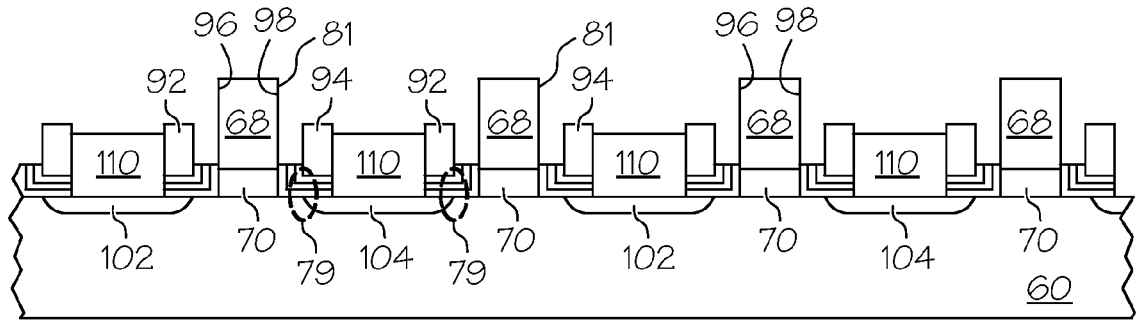

In accordance with one embodiment of the invention dielectric layer 110 is etched back or is polished back, for example by a CMP process, to a thickness about the same as the height of or slightly less than the height of central gate electrodes 68. In a CMP process the silicon nitride sidewall spacers can be used as a polish stop. The CMP process can be followed by a chemical etch. Following the etch back or CMP step, sidewall spacers 84 and a portion of silicon nitride or silicon rich silicon nitride portion 74 of layered structure 77 are removed, for example by etching in hot phosphoric acid ($H_3PO_4$). Layers 72 and 76 of the layered O—R—O structure can then be etched in a dilute hydrofluoric acid solution to reduce the height of the layered structure along sidewall 81 (or respectively 96 and 98) of central gate electrode 68 as illustrated in FIG. 11.

Figure 12:
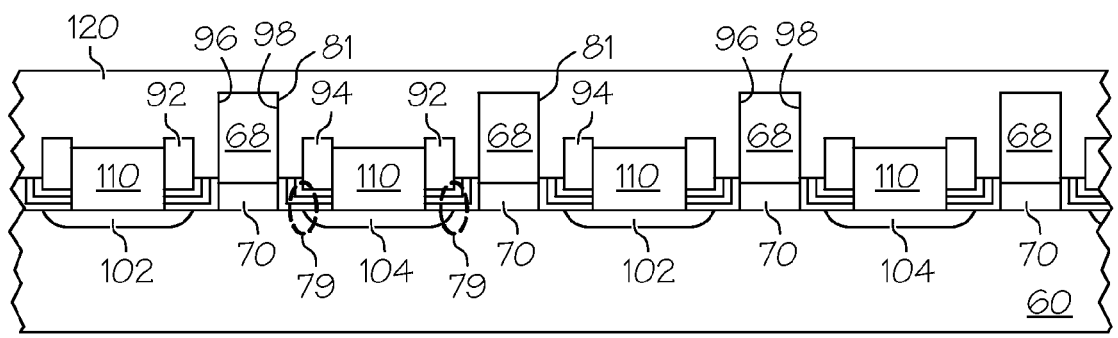

A further layer of conductive material, preferably polycrystalline silicon, is deposited onto the etched back dielectric layer 110 and in contact with central gates 68 and control gates 92 and 94. The polycrystalline silicon can be deposited as an impurity doped layer or can be deposited as an undoped layer that is subsequently impurity doped. The further layer of conductive material is photolithographically patterned and etched to form a word line 120 coupling all of the control gates and central gate electrodes in a row as illustrated in FIG. 12. Those of skill in the art will understand that other processing, either before, during, or after the above described method steps, can be used to form the other devices and interconnects used to implement the remainder of the memory device.

In this structure, in accordance with an embodiment of the invention, central gate electrode 68 overlies a gate dielectric layer 70. On either side of central gate electrode 68 are control gates 92 and 94, and each of the control gates overlies a layered structure charge storage node structure 79 (originally part of layered structure 77) that includes a tunnel dielectric 72, a charge storage layer 74, and a charge barrier layer 76. Gate dielectric layer 70 and tunnel dielectric layer 72 are formed independently and can be formed of different materials and can have different thicknesses. Charge storage nodes 79 of a memory cell 22 and the charge storage layers 74 of those nodes are separated by gate dielectric 70. Prior art dual bit memory storage cells relied upon a continuous charge storage layer with opposite extremities of the layer able to independently store data in the form of stored charge. Unfortunately such prior art structures were susceptible to problems relating to reliability and data retention, especially if the charge storage layer was formed of the slightly conductive silicon rich silicon nitride, because charge could leak across the gate structure from one storage node site to the other. These problems were especially prevalent as a result of repeated cycling of program, erase, and read cycles. Separating the charge storage nodes by an independently formed, relatively thick (in comparison to the tunnel dielectric) gate dielectric avoids the problem of charge leakage or spillage from one storage node to the other. In addition, the memory device fabricated in accordance with the various embodiments of the invention can be effectively erased by Fowler-Nordheim tunneling. FN erasing is desirable because such erasing is faster and requires less power. A FN erase cycle requires the application of relatively high voltages to the word line. In prior art structures such high voltages might cause injection through the central gate dielectric which, in turn, might cause data disturb in the adjacent memory storage node as well as in the memory storage node intended to be erased. Devices fabricated in accordance with the invention are able to be FN erased because the central gate dielectric is relatively thicker that the tunnel dielectric of the memory storage nodes, and that under erase conditions tunneling can occur through the tunnel dielectrics, but there is no charge injection through the thicker central gate dielectric.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a memory device comprising a dual bit memory cell, the method comprising the steps of:
    forming a first channel dielectric layer at a surface of a semiconductor substrate;
    depositing a layer of first conductive material overlying the first channel dielectric layer, the layer of first conductive material having a first thickness;
    patterning the layer of first conductive material and the first channel dielectric layer to form center gate electrodes formed of the first conductive material and exposing a portion of the surface of the semiconductor substrate between adjacent ones of the center gate electrodes;
    forming a layered structure comprising a tunnel dielectric layer, a charge storage layer and a second dielectric layer overlying the center gate electrode and the portion of the semiconductor substrate;
    depositing a layer of second conductive material overlying the layered structure;
    etching the layer of second conductive material to form a region of second conductive material overlying the portion of the semiconductor substrate and having a second thickness less than the first thickness, the step of etching the second conductive material exposing a portion of the layered structure at a sidewall of the center gate electrodes;
    forming sidewall spacers on the portion of the layered structure;
    etching the region of second conductive material and the layered structure using the sidewall spacers as an etch mask;
    ion implanting bit lines in the semiconductor substrate using the sidewall spacers as an implantation mask;
    depositing a third dielectric layer overlying the bit lines;
    etching the third dielectric layer and the sidewall spacers to expose a portion of the layer of first conductive material and a portion of the second conductive material;
    depositing a layer of third conductive material in contact with the portion of the layer of first conductive material and the layer of second conductive material; and patterning the layer of third conductive material to form a word line.

2. The method of claim 1 wherein the step of forming a first channel dielectric layer comprises the step of thermally growing a layer of silicon dioxide having a first thickness, and wherein the step of depositing a layer of first conductive material comprises the step of depositing a layer of polycrystalline silicon.

3. The method of claim 1 wherein the step of forming a layered structure comprises the steps of:
 depositing a layer of tunnel oxide;
 depositing a layer of charge storage material; and
 depositing a layer of oxide.

4. The method of claim 3 wherein the step of depositing a layer of charge storage material comprises the step of depositing a layer of material selected from the group consisting of silicon nitride, silicon rich silicon nitride, and polycrystalline silicon.

5. The method of claim 3 wherein the step of depositing a layer of oxide comprises the step of depositing a layer of a material selected from the group consisting of silicon dioxide and high-K oxide.

6. The method of claim 1 wherein the step of depositing a layer of first conductive material comprises the step of depositing a layer of polycrystalline silicon, the step of depositing a layer of second conductive material comprises the step of depositing a layer of polycrystalline silicon, and the step of depositing a layer of third conductive material comprises the step of depositing a layer of polycrystalline silicon.

7. A method for fabricating a memory device comprising a dual bit memory cell, the method comprising the steps of:
 forming a gate insulator of a first thickness at a surface of a semiconductor substrate;
 forming a central gate electrode overlying the gate insulator and thereafter;
 forming a first memory storage node adjacent a first side of the central gate electrode and a second memory storage node adjacent a second side of the central gate electrode, each of the first memory storage node and the second memory node comprising a tunnel dielectric layer, a charge storage layer, a barrier dielectric layer, and a control gate electrode;
 implanting conductivity determining ions into the semiconductor substrate to form a first bit line in alignment with the first memory storage node and a second bit line in alignment with the second memory storage node; and
 depositing and patterning a layer of conductive material to form a word line coupled to the central gate electrode and to the control gate of each of the first memory storage node and the second memory storage node.

8. The method of claim 7 wherein the step of forming a gate insulator comprises the step of thermally growing a layer of silicon dioxide and wherein the steps of forming a first memory storage node and forming a second memory node comprise the step of depositing a layer of silicon oxide of a second thickness less than the first thickness.

9. The method of claim 7 wherein the step of forming a first memory storage node comprises the steps of:
 depositing a tunnel oxide layer;
 depositing a layer of material selected from the group consisting of silicon nitride, silicon rich silicon nitride, and polycrystalline silicon.

10. The method of claim 7 wherein the step of forming a central gate electrode comprises the steps of:
 depositing a first layer of polycrystalline silicon; and
 patterning the first layer of polycrystalline silicon to form a central gate electrode having a first thickness; and
 wherein the method further comprises the steps of:
 depositing a second layer of polycrystalline silicon; and
 etching back the second layer of polycrystalline silicon to a second thickness less than the first thickness.

11. The method of claim 10 further comprising the steps of:
 forming spacers adjacent the central gate electrode; and
 etching the second layer of polycrystalline silicon using the spacers as an etch mask to form the control gate of each of the first and the second memory storage nodes.

12. A method for fabricating a memory device comprising a dual bit memory cell, the method comprising the steps of:
 forming a gate dielectric layer at a surface of a semiconductor substrate;
 forming a central gate electrode overlying the gate dielectric layer;
 forming a first memory storage node adjacent one side of the gate dielectric layer and a second memory storage node adjacent an opposite side of the gate dielectric layer, each of the first storage node and the second storage node comprising a first dielectric layer and a charge storage layer, the first dielectric layer formed independently of the step of forming a gate dielectric layer;
 forming a first control gate overlying the first memory storage node and a second control gate overlying the second memory storage node; and
 depositing and patterning a conductive layer to form a word line coupled to the central gate electrode, the first control gate and the second control gate.

13. The method of claim 12 wherein the step of forming a first memory storage node comprises the steps of:
 forming a tunnel oxide layer at the surface of the substrate; and
 depositing a layer of charge storage material overlying the tunnel oxide layer.

14. The method of claim 13 wherein the step of depositing a layer of charge storage material comprises the step of depositing a layer of material selected from the group consisting of silicon nitride, silicon rich silicon nitride, and polycrystalline silicon.

15. The method of claim 12 wherein the step of forming a first memory storage node comprises the steps of depositing sequential layers of oxide, nitride, and oxide.

16. The method of claim 15 wherein the step of forming a first memory storage node further comprises the step of depositing a layer of polycrystalline silicon.

17. The method of claim 16 further comprising the steps of:
 etching the layer of polycrystalline silicon to expose a sidewall adjacent the central gate electrode; and
 forming a sidewall spacer on the sidewall.

18. The method of claim 17 further comprising the step of etching the layer of polycrystalline silicon using the sidewall spacer as an etch mask to expose a portion of the surface of the semiconductor substrate.

19. The method of claim 18 further comprising the step of implanting conductivity determining impurities into the semiconductor substrate using the sidewall spacer as an ion implantation mask to form a bit line.

20. The method of claim 19 further comprising the step of etching the sidewall spacer prior to the step of depositing and patterning a conductive layer.

* * * * *